United States Patent [19]
Nygren et al.

[11] Patent Number: 6,110,275
[45] Date of Patent: Aug. 29, 2000

[54] MANUFACTURE OF TITANIUM CARBIDE, NITRIDE AND CARBONITRIDE WHISKERS

[75] Inventors: Mats Nygren, Bromma; Mats Johnsson, Hägersten; Niklas Ahlén, Tullinge; Magnus Ekelund, Järna, all of Sweden

[73] Assignee: Sandvik AB, Sandviken, Sweden

[21] Appl. No.: 08/772,102

[22] Filed: Dec. 20, 1996

Related U.S. Application Data

[63] Continuation-in-part of application No. 08/504,779, Jul. 20, 1995, Pat. No. 5,795,384.

[51] Int. Cl.$^7$ .................................................. C30B 29/62
[52] U.S. Cl. ............................... 117/87; 117/75; 117/76; 117/921; 423/345
[58] Field of Search .................................. 117/75, 76, 87, 117/921, 952, 954

[56] References Cited

U.S. PATENT DOCUMENTS

| | | | |
|---|---|---|---|
| 3,754,076 | 8/1973 | Cutler | 423/345 |
| 4,248,844 | 2/1981 | Ramsey, Jr. et al. | 423/345 |
| 4,283,375 | 8/1981 | Horne, Jr. et al. | 423/345 |
| 4,284,612 | 8/1981 | Horne, Jr. et al. | 423/345 |
| 4,883,559 | 11/1989 | Bamberger | 117/75 |
| 4,888,084 | 12/1989 | Nixdorf et al. | 117/75 |
| 5,094,711 | 3/1992 | Narasimhan et al. | 117/87 |
| 5,118,488 | 6/1992 | Bamberger | 117/87 |
| 5,160,574 | 11/1992 | Pearson et al. | 117/75 |
| 5,221,526 | 6/1993 | Qi et al. | 423/345 |
| 5,256,243 | 10/1993 | Kida | 117/75 |
| 5,383,421 | 1/1995 | Dunmead et al. | 117/4 |
| 5,403,519 | 4/1995 | Rittler | 252/582 |
| 5,404,836 | 4/1995 | Milewski | 117/87 |
| 5,488,016 | 1/1996 | Rittler | 501/39 |

Primary Examiner—Felisa Garrett
Attorney, Agent, or Firm—Burns, Doane, Swecker & Mathis, L.L.P.

[57] ABSTRACT

There is disclosed a method of producing, in large volume and at low cost, titanium carbide, nitride and carbonitride whiskers, with preferably submicron diameters, to be used as reinforcing material. The whiskers are suitable for use as a reinforcement material in a wide range of materials, including metals, intermetallics, plastics, ceramics and metallic bonded hard material. Titanium oxide, hydroxide or alkali compounds thereof are mixed with a carbon source with a volatile part which volatiles at temperatures exceeding 500° C. and in an amount to satisfy the stoichiometric requirements of the carbide or nitride. A halogenide salt is used as a volatilization agent for titanium as well as a catalyst able to dissolve Ti plus C and/or N, such as Ni or Co. The reactant powders are blended in some typical manner, e.g., by using a high speed blender so as to intimately mix them. Finally, the mixed starting material is subjected to nitriding, carbonizing or carbonitriding heat treatments in order to produce the desired whiskers.

8 Claims, 3 Drawing Sheets

MANUFACTURE OF TITANIUM CARBIDE, NITRIDE AND CARBONITRIDE WHISKERS

This application is a continuation-in-part application of U.S. Ser. No. 08/504,779, filed Jul. 20, 1995, now U.S. Pat. No. 5,795,384.

BACKGROUND OF THE INVENTION

The present invention relates to a method of producing, in large volumes and at low cost, titanium carbide, nitride or carbonitride whiskers generally submicron in diameter (having excellent reinforcing properties) suitable as reinforcement material in ceramic cutting tools, metals, intermetallics, plastics and metallic bonded hard materials.

During the last decades great progress has been made in the development of high-performance materials. One of the important reasons for this progress has been the production of inorganic (ceramic) whiskers which have high tensile strength and modulus values as well as resistance to high temperatures. The incorporation of these whiskers into advanced ceramics, metals and polymers has produced composites with superior properties.

Ceramic fibers can be produced by several methods and are most often in the form of single crystals or so-called "whiskers". Several types of ceramic whiskers (oxides, nitrides, carbides and borides) exist. For example, SiC-whiskers are well-known as a successful reinforcement in cutting tool materials. Most of the development work has hence been directed toward silicon carbide whiskers (e.g., $Al_2O_3$-matrix/SiC-whiskers composites). Some efforts have, however, also been made to develop other metal carbide, nitride and boride whiskers, particularly of transition metals such as Ti, Ta and Nb. Whiskers with diameters equal to or exceeding 1–2 micrometers are mostly obtained. Transition metal ceramic whiskers with submicron diameter are, however, not readily available which, so far, has made most of these whisker materials less interesting as reinforcement in different types of advanced ceramic materials.

Ceramic whiskers available commercially are in most cases very expensive and in the case of most transition metal whiskers, no commercial producer exists.

U.S. Pat. No. 3,754,076 discloses a method of producing silicon carbide whiskers by carbothermal reduction of rice hulls. Rice hulls contain both silica and a significant excess of carbon. When using rice hulls as a raw material, the rice hulls and silica therefore are intimately mixed. By heating the raw material, the cellulose give off gaseous products such as carbon dioxide, carbon monoxide, hydrogen, methane and water vapor. The product contains besides SiC whiskers and particles, a large amount of excess carbon which has to be removed.

In U.S. Pat. No. 4,248,844, SiC whiskers are produced in a similar process as in U.S. Pat. No. 3,754,076. A part of the rice hulls are, however, ashed in air to remove the carbon and then remixed with a carbonized fraction of rice hulls.

In U.S. Pat. No. 4,283,375, rice hulls are ashed in air to obtain amorphous $SiO_2$ which is blended with fine particle sized carbon. This process is claimed to give β-SiC whiskers with a good yield.

U.S. Pat. No. 4,284,612 describes a process of preparing SiC whiskers by using chopped carbon fibers made from partly oxidized organic fibers. The fibers should be approximately 10 to 100 μm in length. The patent does not, however, give any explanation why the graphite fibers give a better whisker yield.

U.S. Pat. No. 5,221,526 uses silica and a particulate carbon source together with a boron component and a seeding component to control the shape and size of the produced SiC whiskers.

The carbothermal process of producing SiC whiskers has the general potential to produce large amounts to a low cost if the reaction condition can be properly controlled.

U.S. Pat. No. 4,888,084 discloses a method for the preparation of titanium nitride whiskers by carbothermal reaction of mixtures of $TiO_2$, carbonized organic fibers and a catalyst such as Ni or Co. During the process, a halogen, preferably a chlorine-containing gas, is passed over the mixture. It is thought that the carbon fibers perform three functions: i) provide a high void volume necessary for the whisker growth; ii) act as a reducing agent for the titanium oxide; and iii) act as a nucleation site for the whisker growth.

In U.S. Pat. No. 5,256,243, a process of making TiC whiskers from a mixture of $TiO_2$ or alkali metal compounds thereof, alkali metal chlorides and carbon by carbothermal reduction is described.

U.S. Pat. No. 4,883,559 discloses a process for making transition metal whiskers from melt of cyanide salt, alkali metal oxides and a transition metal oxide.

U.S. Pat. No. 5,094,711 discloses a process for producing single crystal titanium carbide whiskers by chemical vapor deposition (CVD).

U.S. Pat. No. 5,160,574 discloses a process for production of small diameter titanium carbide whiskers by a CVD method.

In the case of transition metal carbide, nitride or carbonitride whiskers, the carbothermal process has not been as successful as in the case of silicon carbide whisker synthesis. The CVD process works with a well-controlled composition of the gas phase, but the cost is high and the possibility of producing large amount of whiskers with submicron diameters is low.

OBJECTS AND SUMMARY OF THE INVENTION

It is an object of this invention to avoid or alleviate the problems of the prior art.

It is further an object of this invention to provide a method of producing, in large volumes and at low cost, high strength whiskers of titanium carbide, nitride or carbonitride, to be used as reinforcing materials in advanced materials, which: (i) are straight; (ii) have smooth surfaces; and (iii) have a diameter in the micron range, preferably being submicron.

These and other objects are provided by a method for producing in large volumes titanium carbide, nitride or carbonitride whiskers comprising intimately mixing, a titanium compound, a carbon powder containing a volatile part which volatilizes at temperatures above 500° C., in an amount to satisfy the stoichiometric requirements of the desired whisker, at least one of the halogenide containing salts LiF, KF, NaF, LiCl, NaCl, KCl, $CaCl_2$, $MgCl_2$ in a Ti:Halogenide molar ratio of 1:(0.1–2), a metal catalyst that is able to dissolve Ti plus C and/or N present in an amount of a Ti:catalyst molar ratio of 1:(0.01–0.5) and heating the mixture to 1000° C.–1800° C., for 0.5–18 hours, at 10 mbar–50 bar pressure in a non-oxidative atmosphere.

DETAILED DESCRIPTION OF THE PREFERRED EMBODIMENTS OF THE INVENTION

The whisker growth in the invention is a VLS-like crystal growth process (VLS=Vapor-Liquid-Solid). This process implies transport of Ti as a vapor species to a liquid catalyst at which the desired whisker is grown as a solid. The halogenide source is added as a volatilizing agent for transportation of titanium in a gas phase, e.g., as a chloride or oxochloride. One of several possible reaction sequences when $Cl_2(g)$ is used as chlorine source is:

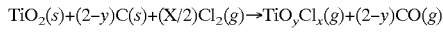

$$TiO_2(s)+(2-y)C(s)+(X/2)Cl_2(g) \rightarrow TiO_yCl_x(g)+(2-y)CO(g)$$

The formation of a volatile Ti-species provides for a gas phase transportation of Ti to the liquid metal catalyst where it reacts further with C and/or N to form a whisker of the composition $TiC_{1-x}N_x$ with $0 \leq X \leq 1$. The obtained X-value depends on the composition of the starting mixture, reaction temperature and atmosphere used. The overall reaction for synthesis of whiskers within the solid solution series $0 \leq X \leq 1$ may be written:

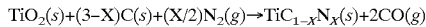

$$TiO_2(s)+(3-X)C(s)+(X/2)N_2(g) \rightarrow TiC_{1-x}N_x(s)+2CO(g)$$

The VLS growth process involves several reactions which one by one and/or in combination have to be optimized in order to obtain maximum yield of whiskers.

According to the presently claimed invention, it is possible to synthesize submicron diameter whiskers of titanium carbide, nitride or carbonitride from starting mixtures of titanium oxides, hydroxides or alkali oxides thereof and carbon powder containing a volatile part and an alkali and/or alkali earth metalhalogenide using a catalyst. The obtained whiskers are of superior quality, are smooth and straight and are useful as reinforcement of different types of materials, e.g., plastics, metals, intermetallics, metallic bonded hard materials and ceramics.

Figure 1:
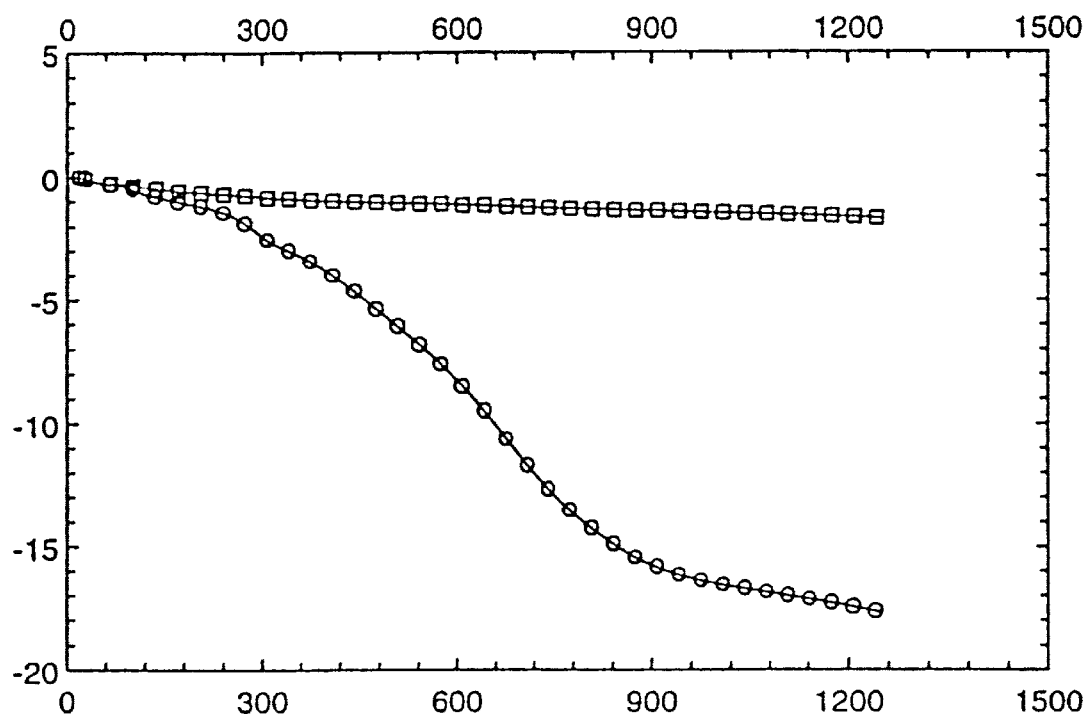
FIG. 1 shows the weight loss in percent versus temperature curve in argon atmosphere for a carbon source with volatile components (○) according to the invention and for a carbon powder without volatile components (□).

According to the presently claimed invention, it has been found that by using a carbon powder, with a primary grain size (that is, a majority of the powder) of ≈10–50 nm, containing a volatile part in amounts between 10 weight % and 30 weight %, which partly volatilizes at temperatures exceeding 500° C., the porosity of the starting mixture is kept at a high level through the whole reaction. This facilitates the growth of whiskers within the volume of the starting mixture and provides the whisker with an accurate mixture of gas species that are generated from the starting mixture. The porosity also makes it easy for nitrogen gas to penetrate the reaction mixture in case of synthesizing a nitride or carbonitride whisker. Carbon powder with such a volatile portion is commercially available, i.e., from Degussa AG. The carbon source is an oxidized carbon black that has oxygen-containing functional groups such as carboxyl and chinon on the surface of the powder which are the volatile portion and which volatize at temperatures above 500° C. (see FIG. 1). It may also contain some hydrocarbons. Such a carbon powder is easily produced in large amounts and is commercially available on the marked, i.e., Degussa Color Black FW200 or FW2, Degussa Special Black 6, 5 or 4. The porosity of the reaction mixture can easily be controlled by varying the type and amount of volatile component to a greater extent compared to when chopped carbon fibers are used as described in earlier patents.

The reaction mixture contains titanium oxide, hydroxide or alkali oxide compound thereof with grain sizes typically between 1 and 50 μm and with, preferably, a fluffy appearance and the above-mentioned carbon powder, in amounts to satisfy the stoichiometric requirements of the desired compound to be produced (e.g., carbide or nitride). A halogenide containing salt like NaF, LiCl, NaCl, KCl, $MgCl_2$ or $CaCl_2$, alone or in combination, in a Ti:halogenide molar ratio of 1:(0.1–2), preferably 1:(0.25–0.5), is added as a volatilization agent for titanium. A chlorine-containing gas may also be added to the synthesis atmosphere as a volatilizing agent, alone or in combination with a halogenide salt. A metal catalyst for the whisker growth that is able to dissolve Ti plus C and/or N, e.g., Ni and/or Co powder of conventional grain size, or a Ni or Co compound, preferably $NiCl_2$, that will decompose to the metal and a volatile component at the reaction temperature, is added in a Ti:catalyst molar ratio of 1:(0.01–0.5), preferably 1:(0.02–0.1).

The reactant powders are mixed, wet or dry, in some conventional manner, e.g., by using a high speed blender so as to intimately mix them. The bulk density of the reaction mixture should be low so that the surfaces of the powders are accessible to reaction gases and so that the reaction products can be removed. The desired bulk density for a particular mixture can be readily obtained by the skilled artisan.

The reactant mixture is heated in a furnace at 1000°–1800° C., preferably 1200°–1600° C., in a non-oxidative atmosphere (such as Ar, $N_2$, $H_2$ or He), with a low gas flow (≈40 ml/min). The reaction temperature ranges from 1000° C. to 1800° C. and the reaction time from 0.5 to 18 hours, and the pressure in the reaction zone from 10 mbar to 50 bar, preferably 0.5 to 5 bar. The reaction takes place in a reaction chamber made of some inert materials, such as alumina, zirconia or graphite or a combination of them, preferably graphite. Different designs can be used but all allowing a gas exchange between the reactor chamber and the surrounding atmosphere.

The carbon:titanium molar ratio to be used depends on the selected titanium source and the desired product (nitride, carbide or carbonitride). Also, depending on the type of titanium source and on the type of whiskers to be produced, different synthesis parameters such as temperature and gas phase composition must be chosen.

$N_2$ gas is utilized as the nitrogen source for the production of nitrogen-containing whiskers according to the presently claimed invention. A single titanium source or a combination of different titanium sources is mixed with the carbon powder. The overall chemical reaction for formulation of TiN from, e.g., $TiO_2$ can be written:

$$TiO_2(s)+2C(s)+½N_2(g) \rightarrow TiN(s)+2CO(g)$$

It is essential for this reaction to proceed to the right, that the CO(g)-partial-pressure is held sufficiently low and that nitrogen gas is provided to the interior of the reaction mixture. This means that the nitrogen gas must penetrate the mixture whose porosity is held at highest possible level using the carbon powder according to the presently claimed invention.

In this way, high quality whiskers of nitride with low levels of residual free oxygen are obtained.

The overall chemical reaction for formation of TiC from, e.g., $TiO_2$ can be written:

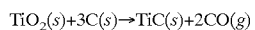

$$TiO_2(s)+3C(s) \rightarrow TiC(s)+2CO(g)$$

The temperature is preferably held between 1200° C. and 1600° C. in an argon atmosphere for three hours. Argon gas is preferred instead of nitrogen gas since the titanium nitride is thermodynamically stable compared to titanium carbide at the reaction temperature.

By choosing an intermediate amount of carbon, a nitrogen atmosphere and a temperature in the same range as for the carbide synthesis, carbonitride whiskers are obtained.

The result of the synthesis according to the presently claimed invention, is a mixture of generally submicron diameter whiskers in an amount of 70% to 90% by volume. In addition, submicron particles of the same compound are formed. This high yield makes an extra separation of whiskers and particles unnecessary. However, if an even higher yield is desired, a subsequent refinement step can be applied.

The preparation conditions given above, both with regard to the starting formulation and to the synthesis parameters, are related to the equipment used, design of the reaction chamber, the choice of raw materials, etc. It is within the purview of the skilled artisan using other equipment and other raw materials to determine the optimal conditions by experiments.

The invention is additionally illustrated in connection with the following Examples which are to be considered as illustrative of the present invention. It should be understood, however, that the invention is not limited to the specific details of the Examples.

EXAMPLE 1

$TiO_2$ rutile powder (Tioxide sandy rutile) was mixed with carbon powder (Degussa FW200), NaCl (Merck) and Ni powder (Cerac 325 mesh) with mole fractions $TiO_2$:C=1:3, $TiO_2$:NaCl=1:0.5, and $TiO_2$:Ni=1:0.05. The carbon source contained 21 weight % volatile components which was compensated for.

The powders were mixed in ethanol, mixed on a rolling bench for 24 hours, dried and subjected to carbothermal reduction with the following process parameters:

T=1500° C.

t=3 hours

Protecting atmosphere=Ar(g)

p(Ar)=1 bar

Figure 2:
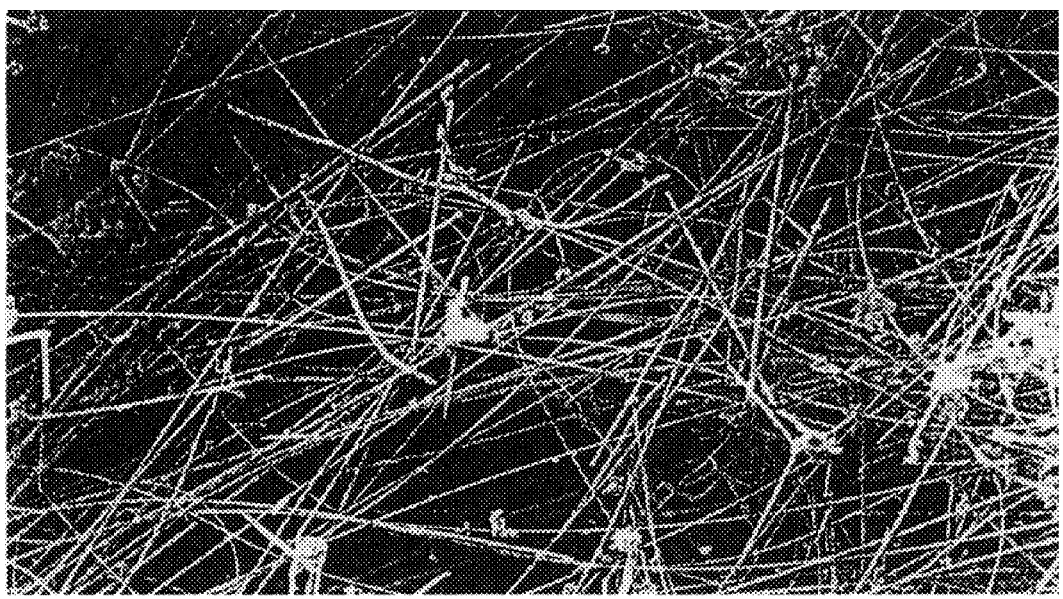
FIG. 2 shows TiC whiskers in 1700X SEM micrograph synthesized according to the presently claimed invention.

The whiskers produced consisted of Ti with a lattice parameter of a=4.3151(3) Å. The whisker yield was approximately 80% by volume. The whiskers were straight and of submicron size (see FIG. 2).

EXAMPLE 2

$TiO_2$ rutile powder (Tioxide sandy rutile) was mixed with carbon powder (Degussa FW200), $CaCl_2$ (Merck) and Ni powder (Cerac 325 mesh) with mole fractions $TiO_2$:C=1:3, $TiO_2$:$CaCl_2$=1:0.25, and $TiO_2$:Ni=1:0.05. The carbon source contained 21 weight % volatile components which was compensated for.

The powders were mixed in 2-propanol, mixed on a rolling bench for 24 hours, dried and subjected to carbothermal reduction with the following process parameters:

T=1480° C.

t=3 hours

Protecting atmosphere=Ar(g)

p(Ar)=1 bar

The whiskers produced consisted of TiC with a lattice parameter of a=4.3172(5) Å. The whisker yield was approximately 70% by volume. The whiskers are straight and of submicron size. The whiskers have the same appearance as those prepared in connection with Example 1.

EXAMPLE 3

$TiO_2$ rutile powder (Tioxide sandy rutile) was mixed with carbon powder (Degussa FW200), NaCl (Merck) and Ni powder (Cerac 325 mesh) with mole fractions $TiO_2$:C=1:2, $TiO_2$:NaCl=1:0.5, and $TiO_2$:Ni=1:0.1. The carbon source contained 21 weight % volatile components which was compensated for.

The powders were mixed in ethanol, mixed on a rolling bench for 24 hours, dried and subjected to a carbothermal nitridation with the following process parameters:

T=1250° C.

t=6 hours

Protecting atmosphere=$N_2$(g)

p($N_2$)=1 bar

Figure 3:
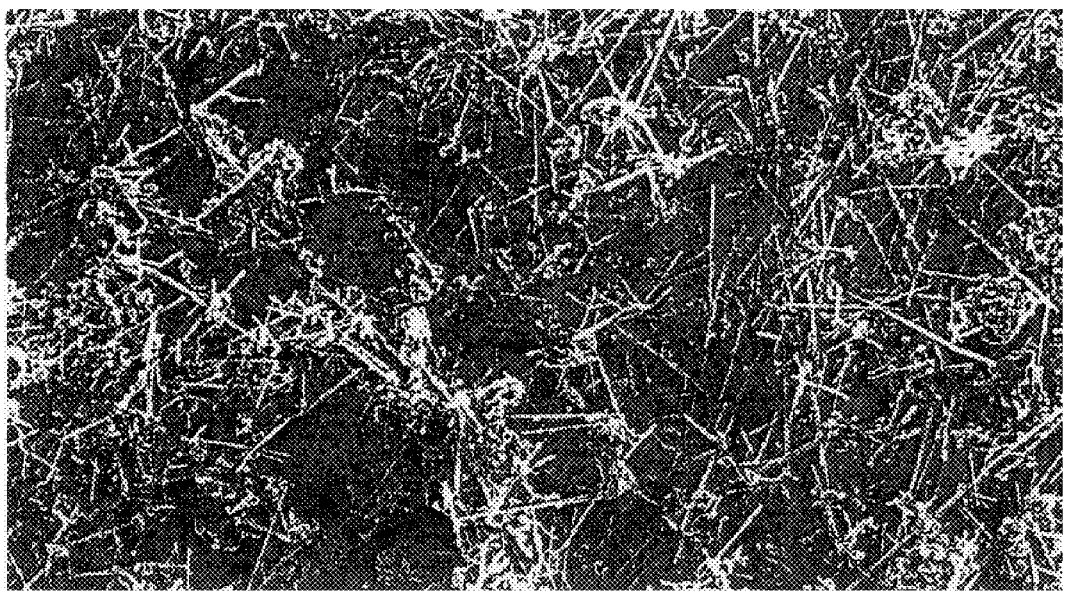
FIG. 3 shows TiN whiskers in 800X SEM micrograph synthesized according to the presently claimed invention.

The whiskers produced consisted of TiN with a lattice parameter of a=4.2473(1) Å. The whisker yield was approximately 80% by volume. The whiskers are straight and of submicron size (see FIG. 3).

EXAMPLE 4

$TiO_2$ rutile powder (Tioxide sandy rutile) was mixed with carbon powder (Degussa FW200), NaCl (Merck) and Ni powder (Cerac 325 mesh) with mole fractions $TiO_2$:C=1:2, $TiO_2$:NaCl=1:0.5, and $TiO_2$:$NiCl_2$=1:0.2. The carbon source contained 21 weight % volatile components which was compensated for.

The powders were mixed in ethanol, mixed on a rolling bench for 24 hours, dried and subjected to a carbothermal nitridation with the following process parameters:

T=1250° C.

t=4 hours

Protecting atmosphere=$N_2$(g)

p($N_2$)=1 bar

The whiskers produced consisted of TiN with a lattice parameter of a=4.2488(4) Å. The whisker yield was approximately 70% by volume.

The whiskers have the same appearance as those prepared in connection with Example 3.

The principles, preferred embodiments and modes of operation of the present invention have been described in the foregoing specification. The invention which is intended to be protected herein, however, is not to be construed as limited to the particular forms disclosed, since these are to be regarded as illustrative rather than restrictive. Variations and changes may be made by those skilled in the art without departing from the spirit of the invention.

What is claimed is:

1. A method for producing large volumes of titanium carbide, nitride or carbonitride whiskers comprising mixing a titanium compound, a carbon powder containing a volatile part which volatilizes at temperatures above 500° C., at least one of the halogenide containing salts LiF, KF, NaF, LiCl, NaCl, KCl, $CaCl_2$, $MgCl_2$ in a Ti:Halogenide molar ratio of 1:(0.1–2), a metal catalyst that is able to dissolve Ti plus at least one of C and N present in an amount of a Ti:catalyst molar ratio of 1:(0.01–0.5), and heating the mixture to 1000° C.–1800° C., for 0.5–18 hours, at 10 mbar–50 bar pressure in a non-oxidative atmosphere.

2. The method of claim 1 wherein the atmosphere is $N_2$ or Ar.

3. The method of claim 1 wherein the titanium source is at least one of an oxide, hydroxide and alkali titanium oxide compound.

4. The method of claim 1 wherein the carbon powder has a primary grain size of 10–50 nm.

5. The method of claim 1 wherein the volatile part of the carbon powder is from 10–30 weight % of the carbon powder.

6. The method of claim 1 wherein the mixture is heated to a temperature of 1200°–1600° C.

7. The method of claim 1 wherein the atmosphere contains a chlorine-containing gas either in addition to or instead of the halogenide-containing salt.

8. The method of claim 1 wherein the catalyst comprises Ni, Co and mixtures thereof.

* * * * *